United States Patent
Ricard et al.

(10) Patent No.: US 7,132,902 B2
(45) Date of Patent: Nov. 7, 2006

(54) OSCILLATOR CIRCUIT FOR EEPROM HIGH VOLTAGE GENERATOR

(75) Inventors: Stephane Ricard, Marseilles (FR); Marc Merandat, Venelles (FR); Jerome Pratlong, Aix en Provence (FR); Sylvie B. Vergnes, Trets (FR); Laureline Bour, Pourrieres (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/995,458

(22) Filed: Nov. 22, 2004

(65) Prior Publication Data

US 2006/0038625 A1    Feb. 23, 2006

(30) Foreign Application Priority Data

Aug. 17, 2004  (FR) .................................. 04 08931

(51) Int. Cl.
   *H03L 1/00*    (2006.01)
(52) U.S. Cl. .................... 331/176; 331/177 R; 331/57; 331/34; 327/536; 327/538
(58) Field of Classification Search ................ 331/143, 331/135, 111, 177 R, 57, 176, 34; 327/536, 327/538

See application file for complete search history.

(56) References Cited

U.S. PATENT DOCUMENTS

| | | | |
|---|---|---|---|
| 5,418,751 A | 5/1995 | Kaiser | 365/211 |
| 5,532,653 A | 7/1996 | Adkins | 331/143 |
| 5,581,215 A | 12/1996 | Ogasawara | 331/45 |
| 5,793,260 A | 8/1998 | Fawal et al. | 331/111 |
| 5,903,506 A | 5/1999 | Blodgett | 365/222 |
| 5,956,289 A | 9/1999 | Norman et al. | 365/233 |
| 6,137,335 A | 10/2000 | Proebsting | 327/281 |
| 6,362,697 B1 | 3/2002 | Pulvirenti | 331/111 |
| 6,515,535 B1 | 2/2003 | Myono | 327/536 |
| 6,590,464 B1 | 7/2003 | Lin et al. | 331/135 |
| 6,621,675 B1 * | 9/2003 | Ingino, Jr. | 361/91.1 |

FOREIGN PATENT DOCUMENTS

| | | |
|---|---|---|
| DE | 43 40 924 | 6/1995 |
| EP | 0 735 677 | 10/1996 |
| EP | 0 834 981 | 4/1998 |
| EP | 0 901 127 | 3/1999 |

* cited by examiner

*Primary Examiner*—Arnold Kinkead
(74) *Attorney, Agent, or Firm*—Schneck & Schneck; Thomas Schneck

(57) ABSTRACT

A semiconductor oscillator circuit for an EEPROM high voltage charge pump utilizes a current generating means to charge a first and a second capacitor alternatively. The charging current produced by the current generating means is inversely proportional to the ambient temperature. The charging current is proportional to the supply voltage and consequently, the oscillator frequency output remains constant over a variable voltage supply. Such a constant frequency characteristic makes a low voltage operation possible, but slows down the oscillator frequency as temperature increases. The slowing of oscillator frequency limits the charge pump output voltage and enhances the lifespan of the EEPROM cells.

16 Claims, 4 Drawing Sheets

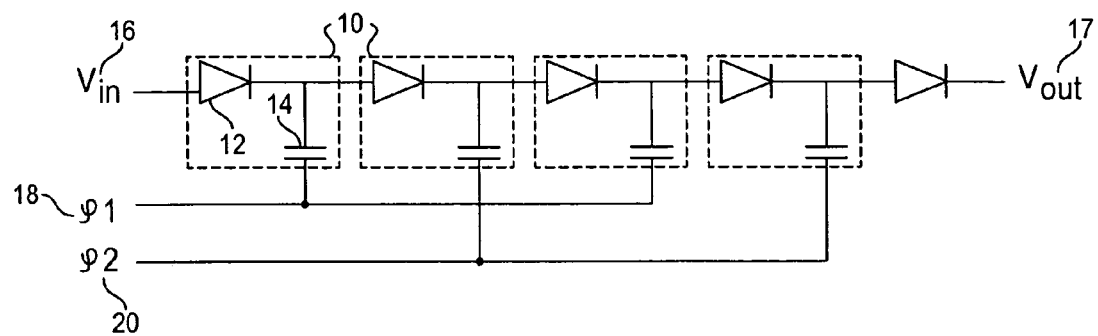
Fig._1 *(Prior Art)*
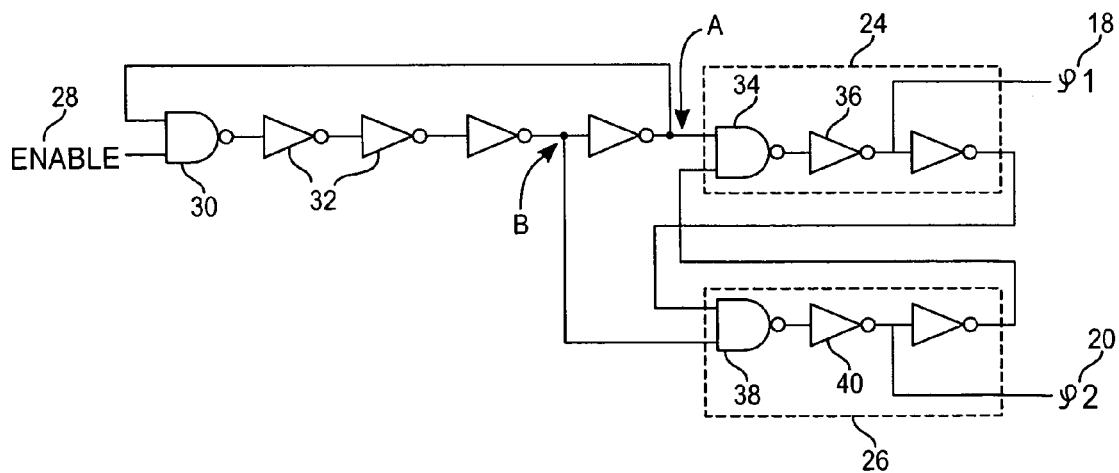
Fig._2 *(Prior Art)*

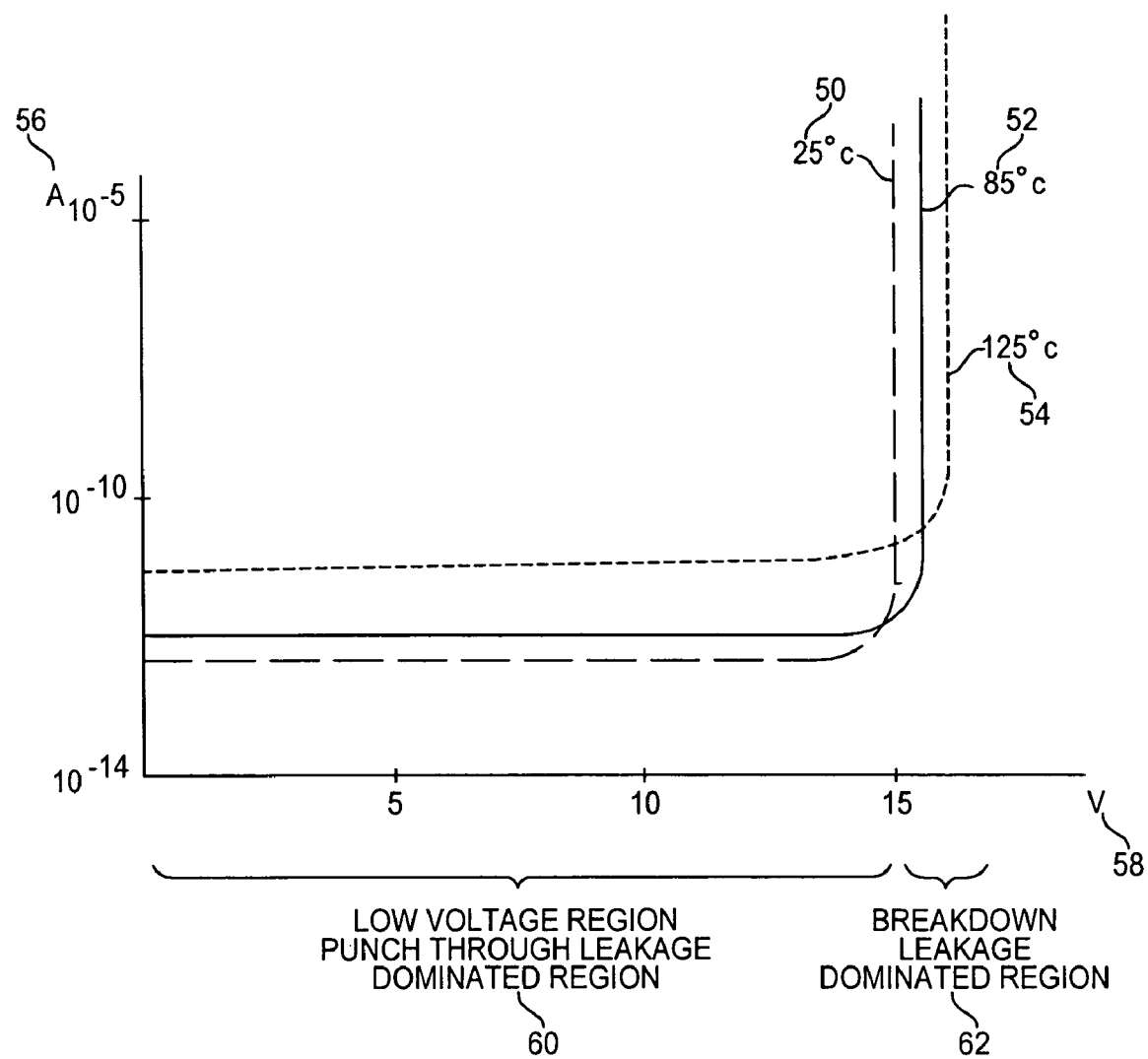
Fig._3

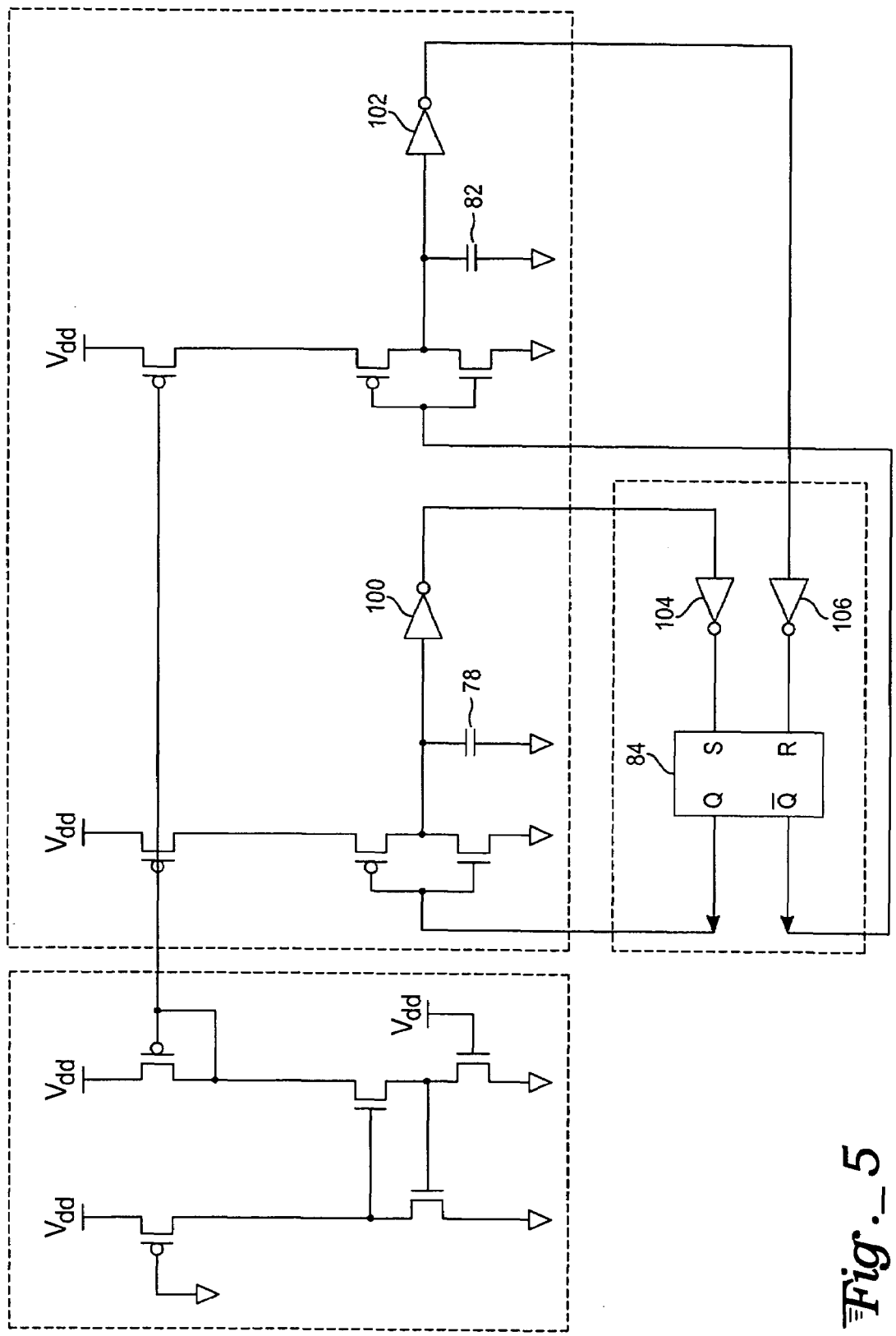
Fig._5

OSCILLATOR CIRCUIT FOR EEPROM HIGH VOLTAGE GENERATOR

TECHNICAL FIELD

The present invention relates to an oscillator circuit, and in particular, the present invention relates to semiconductor oscillators for use in charge pump systems.

BACKGROUND ART

In a typical non-volatile memory device such as electrically erasable programmable read only memories (EEPROM), a charge pump is needed to generate the high internal programming voltage necessary to achieve electron tunneling during programming steps. The charge pump circuit takes in a low voltage input and generates a high voltage output using multiple voltage pumping stages.

FIG. 1 shows a simple charge pump circuit, which is commonly known as a Dickson charge pump. The Dickson charge pump includes a plurality of diode ladder stages 10 wherein complementary charge pump clock signals 18, 20 are provided to successive stages. Each diode ladder stage 10 comprises a diode 12 and a capacitor 14 connected together. The charge pump circuit operates by passing charges along successive stages of the diode ladder 10 using capacitive coupling of the complementary charge pump clock signals 18, 20 that are provided by an oscillator circuit. Since the voltage is not reset after each pumping cycle, the average node potential increases progressively from the input terminal 16 to the output terminal 17 of the diode ladder 10. The maximum output voltage $V_{max}$ reached by the Dickson charge pump can be derived from equation (1) below:

$$V_{max}=(N+1)\times(V_{dd}-V_t) \quad (1)$$

where N is the number of diodes 12 in the ladder, $V_{dd}$ is the supply voltage, and $V_t$ is the threshold voltage of the diodes 12.

The output current $I_{out}$ provided by the Dickson charge pump can be derived from equation (2) below:

$$I_{out}=N\times C\times(V_{dd}-V_t)\times F_{osc} \quad (2)$$

where C is the capacitance of capacitors 14, and $F_{osc}$ is the oscillator output frequency.

These two equations shows the output sensitivity of the Dickson charge pump to the power supply $V_{dd}$. As shown in equations (1) and (2), both the maximum voltage output $V_{max}$ and the output current $I_{out}$ decrease with decreasing supply voltage $V_{dd}$. Equation (2) also shows that output current $I_{out}$ is proportional to the oscillator frequency.

FIG. 2 shows a simple ring oscillator that can be used to drive the Dickson charge pump circuit shown in FIG. 1. The ring oscillator is composed of a number of inverter elements 32 connected in a circular manner. An input NAND gate 30 provides a means for disabling the oscillator when a low voltage signal is presented at an ENABLE terminal 28. The oscillator outputs are stable (i.e., φ1=1, φ2=0) when the enable signal 28 is low. When enabled, the input NAND gate 30 inverts the signal from the terminal "A." The signal is then propagated through the inverters 32 back to point "A." This process continues until the ENABLE signal 28 goes back to low. The amount of time taken to propagate the signal back to point "A" is determined by the inverter delay. This inverter delay is dependent on the supply voltage $V_{dd}$ because the supply voltage $V_{dd}$ is the maximum gate-source voltage that can be applied to the transistors within each inverter stage 32. It is the gate-source voltage that determines the current drive of each inverter stage, which ultimately determines the propagation speed of each inverter stage 32. The signal that is present at point "A" is then provided to a first clock driver portion 24, which is composed of a NAND gate 34, and two inverters 36 connected in a serial manner and generates the φ1 signal 18. The signal that is present at point "B" is provided to a second clock drive portion 26, which is composed of a NAND gate 38 and two inverters 40 connected in a serial manner and generates the φ2 signal 20. The φ1 18 and φ2 20 signals are 180° out of phase with each other.

A drawback of the ring oscillator is that the output frequency φ1 18 and φ2 20 changes with the supply voltage $V_{dd}$. More specifically, a lower $V_{dd}$ causes the oscillator to generate a lower operating frequency output. Together with a lower voltage input level, a charge pump system that employs such an oscillator would generate a relatively weak charge pump output voltage. As a result, the charge pump may fail to provide the desired output current. Therefore, it would be desirable to have an oscillator that is not sensitive to the supply voltage $V_{dd}$.

For charge pump systems that supply output voltages to an EEPROM array, a major consideration pertains to leakages through the transistors that are connected to the output voltage terminal $V_{out}$ 17 (FIG. 1) of the charge pump. There are two main mechanisms for such leakages: the first mechanism is a drain to source current (punch-through) leakage that increases with increasing temperature. The second mechanism is a breakdown leakage that has a threshold that decreases with increasing temperature. FIG. 3 shows the relationship between leakage current 56 and voltage output 58. As shown in FIG. 3, at a low voltage output region 60 (between 0 and 15 volt output), current leakage increases with increasing temperature. In this region, punch-through leakage dominates. However, breakdown leakage occurs at a lower threshold when the temperature is low. For instance, the breakdown occurs at about 15 Volts when the temperature is 25° C. (as denoted by numeral 50) and at about 16 Volts when the temperature is 125° C. (as denoted by numeral 54). Since the programming voltage for EEPROM cells is at about 15.5 volts, when the ambient temperature is at 25° C., the major leakage during programming is due to breakdown leakage. As is shown in FIG. 3, once the breakdown leakage threshold is reached, the leakage current goes up exponentially. As a result, the programming operation of the EEPROM cells may fail, as the charge pump may not be able to keep up with the leakage current.

On the other hand, when the temperature is high, such as 125° C., the breakdown threshold voltage is raised to about 16 V. As a result, the breakdown leakage remains low during the EEPROM cell programming stage. Thus, a charge pump oscillator producing a stable frequency throughout the operating temperature range leads to a heightened programming voltage at high operating temperatures. The drawback of having a heightened programming voltage is that the lifetime of EEPROM cells reduces significantly even with a relatively small increase in programming voltage. For instance, studies have shown that as the temperature rises from 25° C. to 85° C., the endurance of the EEPROM cells is reduced by a factor of three due to the corresponding increase in programming voltage. Therefore, it would be desirable to have a charge pump oscillator that produces an output frequency that is inversely proportional to temperature changes and stable with regard to the supply voltage.

DISCLOSURE OF INVENTION

The above objective is achieved by constructing a charge pump network with oscillator components fabricated from semiconductor devices. The combination of key timing elements being crafted from semiconductor devices and the properties of semiconductor physics those devices possess, produces the desired combination of supply voltage independence and inverse proportionality to operating temperature.

For instance, key internal timing is developed from an RC time constant. The C component, or capacitance, is derived from semiconductor devices and is constant. The R, or resistive component, is derived from channel resistances of internal transistors. The effective resistance of these components is a ratio of the voltage across the device and the current passing through. Each of these characteristics is proportional to supply voltage. Therefore, the ratio of voltage and current, or the effective resistance, is independent of supply voltage.

In regard to temperature dependence, the same RC time constant is considered with respect to charging current. The basic transconductance of the transistor devices charging the capacitance is inversely proportional to temperature. Therefore, the charge current produced from these devices has the same characteristic and creates a time constant with an inverse proportionality to temperature. By crafting an oscillator network with a component configuration to take advantage of an RC time constant and by fabricating oscillator components from semiconductor devices, first principles of semiconductor physics are employed to effect the desired characteristics in a charge pump oscillator.

BRIEF DESCRIPTION OF DRAWINGS

FIG. 1 is a circuit logic diagram of a charge pump of the prior art.

FIG. 2 is a circuit logic diagram of a ring oscillator of the prior art.

FIG. 3 is a graph showing the effect of temperature on punch-through current leakage and breakdown current leakage for a typical semiconductor transistor.

FIG. 5 is a circuit logic diagram showing another embodiment of the present invention.

BEST MODE FOR CARRYING OUT THE INVENTION

Figure 4:
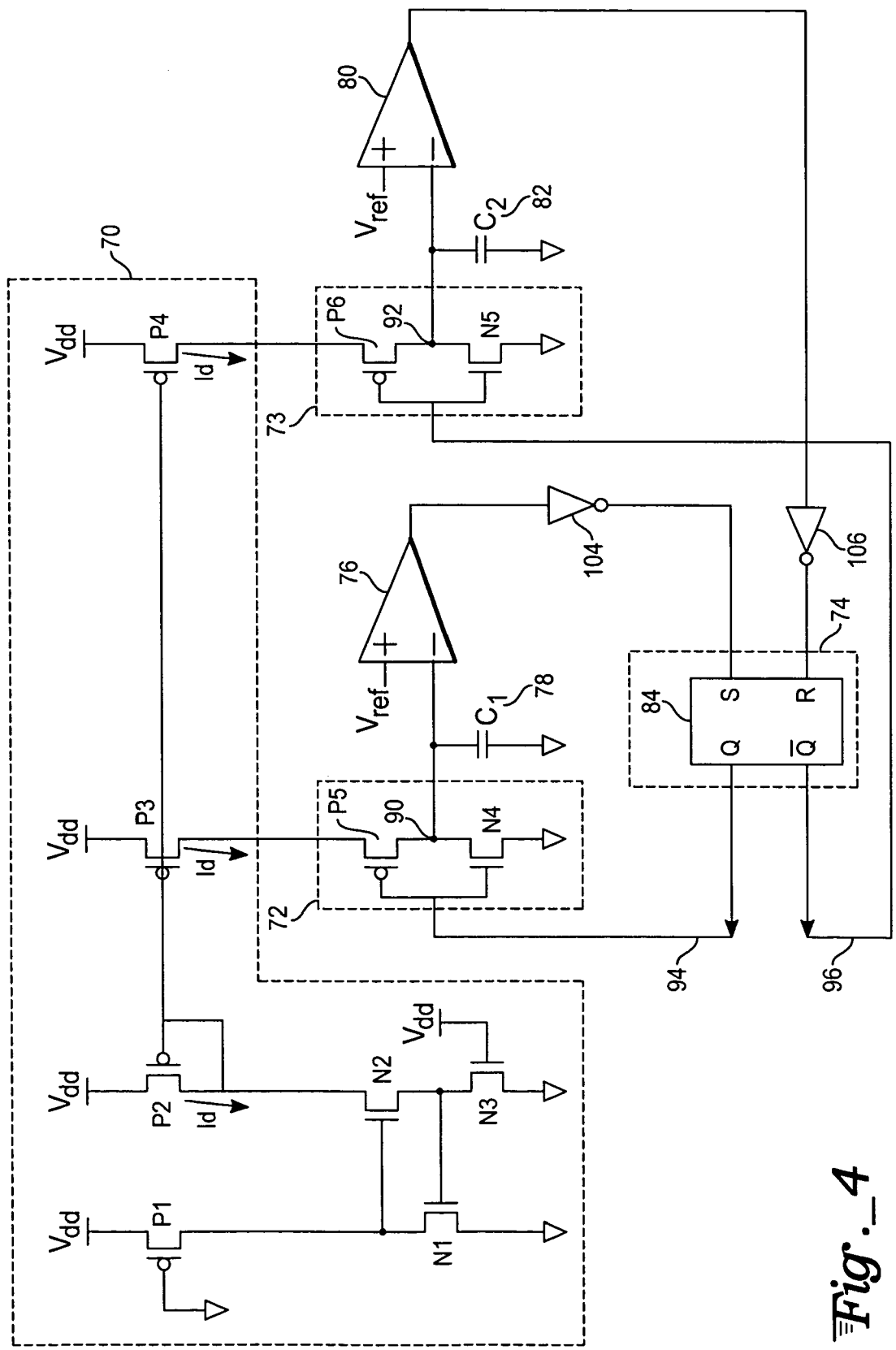
FIG. 4 is a circuit logic diagram showing one embodiment of the present invention.

With reference to FIG. 4, an oscillator circuit according to an exemplary embodiment of the present invention includes five main parts: a current generating means 70 for the production of a current, $I_d$, that is inversely proportional to temperature, a first and a second capacitor 78, 82 connected to the current generator 70 through a first and a second switching means 72, 73, a first and second voltage comparing means 76, 80 connected to the first and second capacitor 78, 82, and a logic means 74 to facilitate the switching of charging current $I_d$ to the first and second capacitors 78, 82.

The current generating means 70 comprises a first PMOS transistor P1 having a source connected to $V_{dd}$, a drain connected to a drain of a first NMOS transistor N1 and a gate of a second NMOS transistor N2. The gate of P1 and the drain of N1 connect to ground while the gate of N1 connects to a source of N2 and a drain of a third NMOS transistor N3. A drain of N2 connects to a drain and a gate of a second PMOS transistor P2. A source of N3 connects to ground while a gate of N3 and a source of P2 connect to $V_{dd}$.

Since N1 operates in saturation conditions, the net at the gate of N1 is not very sensitive to the $V_{dd}$ value and thus can be considered as a constant. Assuming $V_{gs}$ of N3 is equal to $V_{dd}$ and that $V_{dd} > V_{DS} + V_t$, N3 is operating in linear region and therefore functions as a resistor. The current generated follows the equation shown below:

$$I_d = \mu_n C_{ox} \frac{W}{L}\left[(V_{gs} - V_t)V_{DS} - \frac{V_{DS}^2}{2}\right] \quad (3)$$

where $\mu_n C_{ox}$ is the process transconductance parameter and its value is determined by the fabrication technology. W/L relates to the dimension of the induced channel in N3. Since the gate to source voltage $V_{gs}$ of N3 is equivalent to $V_{dd}$, assuming $V_{ds}$ is constant, the generated current $I_d$ is proportional to the supply voltage $V_{dd}$. Furthermore, since the process transconductance parameter $\mu_n C_{ox}$ is inversely proportional to the temperature, an increase in temperature results in a decrease in Id.

The generated current, $I_d$, is mirrored to the first and second switching means by a third and a fourth PMOS transistor P3, P4. The sources of P3 and P4 are connected to $V_{dd}$ while the drains of P3 and P4 are connected to the source of a fifth and a sixth PMOS transistor P5, P6, which forms a part of the first and second switching means 72, 73 respectively. The drains of P5 and P6 are connected to the drains of a fourth and a fifth NMOS transistor N4, N5 to form a first and second common node 90, 92. The gates of P5 and N4 are connected to the Q output terminal of an SR latch 84, which serves as the logic means 74, while the gates of P6 and N5 connects to the $\overline{Q}$ output terminal of SR latch 84. The first capacitor 78 has a first terminal connected to the first common node 90 and a negative terminal of a first op amp 76. The first op amp 76 serves as a voltage comparing means. The second capacitor 82 has a first terminal connected to the second common node 92 and a negative terminal of a second op amp 80. A positive terminal of the first and second op amp 76, 80 are connected to a threshold voltage $V_t$, which functions as a reference voltage. The output terminal of the first op amp 76 connects to the S input terminal of the SR latch 84 through a first inverter 104 while the output terminal of the second op amp 80 connects to the "R" input terminal of the SR latch 84 through a second inverter 106.

The mirrored current, $I_d$, charges the first capacitor 78 and the second capacitor 82 in an alternative manner as described below. The charging of the first and second capacitors 78, 82 are dictated by a first and second control signals 94, 96 coming out of the Q output terminal and the $\overline{Q}$ output terminal of the SR latch 84 respectively. Since the output signal at the Q and $\overline{Q}$ output terminals are complementary to one another, only one capacitor is charged at any one time. With a low voltage signal at the Q output terminal, P5 is turned on and N4 is turned off; as a result, the first capacitor 78 is charged up by the mirrored current, $I_d$. In the meantime, a complementary high signal presented at the $\overline{Q}$ output terminal of the SR latch 84 turns off P6 and turns on N5. This setting connects the first terminal of the second capacitor 82 to ground, thereby discharging the second capacitor 82. Once the voltage level of the first capacitor 78 reaches $V_t$, the output of the first op amp 76 issues an activation signal, which in turns sets the SR latch 84. As a result, the Q output terminal goes high, thereby connecting the first terminal of the first capacitor 78 to ground and discharges the first capacitor. In the meantime, since the $\overline{Q}$ output terminal is now low, the first terminal of the second capacitor is connected to the drain of P4. As a result, the second capacitor 82 is being charged by $I_d$. When the voltage level at the second capacitor 82 reaches $V_t$, the output of the second op amp 80 provides an activating signal. Consequently, the SR latch 84 is reset, which results in a low signal at the Q output terminal and a high signal output at the $\overline{Q}$ output terminal. Thus, the charging and discharging of the first and second capacitors 78, 82 is reversed. This oscillatory period is predicted by equation (4) below:

$$T_{OSC} = 2 \cdot C \cdot \frac{V_t}{I_d} \quad (4)$$

Assuming that the capacitance C is constant, since both the threshold voltage $V_t$ and the mirrored current, $I_d$, are both proportional to the supply voltage $V_{dd}$, the frequency generated by the oscillator is not supply voltage dependent.

FIG. 5 shows another exemplary embodiment of the present invention that uses a third and a fourth inverter 100, 102 in the place of the first and the second op amp 76, 80 in FIG. 4. An output of each inverter 100, 102 switches from high to low whenever an input of the inverter 100, 102 rises above the threshold voltage. Therefore, an internal threshold voltage of each inverter 100, 102 takes the place of the reference voltage connected to the positive terminal of the op amps 76, 80 shown in FIG. 4.

The operation of the circuit shown in FIG. 5 is similar to that of the one shown in FIG. 4. While the Q output terminal of the SR latch 84 is low and the $\overline{Q}$ output terminal of the SR latch 84 is high, the first capacitor 78 is being charged and the second capacitor 82 is being discharged. Once the voltage level of the first capacitor 78 reaches the threshold voltage of the first inverter 100, the output of the first inverter goes low. The low signal become a high signal after it passes through the third inverter 104 and, as a result, the SR latch 84 is set. Subsequently, the first capacitor 78 begins to discharge while the second capacitor 82 is being charged by the mirrored current, $I_d$. Once the charge level at the second capacitor reaches the threshold voltage $V_t$ of the second inverter 102, the SR latch 84 is reset and the mirrored current $I_d$ is redirected to the charging of the first capacitor 78 while the second capacitor 82 is being discharged. The oscillatory period of the circuit in FIG. 5 obeys equation 4 as well and therefore, it is also independent of the supply voltage $V_{dd}$.

Although the present invention has been described in terms of exemplary embodiments, one skilled in the art recognizes that additional embodiments could readily be conceived which are still within a scope of the present invention. For example, a particular complimentary switching means is presented as being an SR latch, a voltage divider is shown as an NMOS device biased with certain device threshold offsets, individual switching means are presented as being PMOS or NMOS transistors, specified current regulation means are offered as being voltage following current generating PMOS devices, specific linear resistors depicted as NMOS transistors biased in a non-saturated mode of operation, certain reference voltage generators are represented as being saturated PMOS load devices with a gate connected to output, particular electrical charge storage means depicted as capacitors, and voltage regulation means depicted as being current mirrors wherein all are presented as exemplary embodiments for implementing the present invention.

However, a skilled artisan could readily implement different approaches to, for example, the switching means by using Bipolar Junction Transistors, Junction Field Effect Transistors, or Insulated Gate Bipolar Transistors and accomplish the same voltage controlling and current steering means. A skilled artisan might employ alternative reference voltage generators and/or voltage regulation means from such embodiments as a series combination of load devices between appropriate voltage busses composed of enhancement mode or depletion mode configurations of NMOS or PMOS transistors or reverse biased zener diodes, and achieve the same voltage reference generation result. A skilled artisan might construct a current reference source from a voltage reference generator as a controlling input to a series combination of a non-saturated PMOS load device and NMOS drive transistor. One skilled in the art might, alternatively, implement complimentary switching means by a toggle or T-type flip-flop or a D-type flip-flop with a Q-bar output tied to the D input which would perform the same function when clocked. A skilled artisan might compose resistive elements for a voltage divider from non-saturated NMOS load devices with a gate coupled to a drain, make a linear resistor from a non-saturated load configuration of an NMOS transistor, and construct electrical charge storage means as an arrangement of a MOS transistor device with a gate input as a first terminal and a source and a drain coupled to form a second terminal. All of these embodiments are within a scope of the present invention.

What is claimed is:

1. A semiconductor oscillator circuit comprising:
a current generating means for producing a current at an output, said current being inversely proportional to an operating temperature;
a first and a second charge storage means for storing electrical charge from said current generating means in an alternating sequence, said alternating sequence producing a frequency of said semiconductor oscillator circuit, said frequency being inversely proportional to said operating temperature;
a first and a second current steering means for steering current, said first and said second current steering means configured to receive a control signal at a control terminal for determining a coupling of an output to an input terminal of each of said charge storage means to either said output of said current generating means or to a circuit ground terminal;
a first and a second voltage detection means for producing an activation signal at an output upon attaining a predetermined magnitude of voltage by a potential at one of said input terminals of said charge storage means coupled to a respective input of said voltage detection means; and
a complimentary switching means for producing a complimentary pair of control signals to said control terminals of said first and second current steering means, said complimentary switching means configured to toggle a potential of said complimentary pair of control signals at a receipt of said activation signal from either of said voltage detection means.

2. The semiconductor oscillator circuit of claim 1, wherein said inverse proportionality of frequency producing a programming voltage of a magnitude for maintaining a longevity of a programmed memory cell.

3. The semiconductor oscillator circuit of claim 1, wherein a frequency of said semiconductor oscillator circuit is independent of a variation of plus 10 percent to minus 15 percent of a power supply voltage.

4. The semiconductor oscillator circuit of claim 1, wherein said complimentary switch means is an SR latch.

5. The semiconductor oscillator circuit of claim 1, wherein each of said first and said second voltage detection means is an op amp, each of said op amps having a negative terminal coupled to said input terminal of either one of said first or said second charge storage means and a positive terminal coupled to a voltage reference.

6. The semiconductor oscillator circuit of claim 1, wherein each of said first and said second voltage detection means is an inverter, each of said inverters having an input terminal coupled to said input terminal of either one of said first or said second charge storage means.

7. The semiconductor oscillator circuit of claim 1, wherein said current generating means further comprises:
a linear resistive means for increasing a value of resistance with an increasing operating temperature and coupled to said circuit ground terminal;
a current generating means for producing a reference current flow and coupled to a power supply terminal;
a current limiting means for limiting a current flowing through said current generating means and coupled at a control input to said linear resistive means and further coupled between said current generating means and said circuit ground terminal;
a current mirror means for generating a reference current proportional to a current flowing through said linear resistive means and coupled to said power supply terminal; and
a voltage divider means for maintaining a voltage difference between said current mirror means and said linear resistive means and coupled at a control input to an output of said current generating means and further coupled between said current mirror means and said linear resistive means.

8. The semiconductor oscillator circuit of claim 1, wherein said current steering means comprises:
a first switching means for steering current with a low potential applied at a first control input and coupled at a second input to said current generation device;
a second switching means for steering current with a high potential applied at a fist control input and coupled at a second input to an output of said first switching means and coupled at an output to said circuit ground terminal;
a control terminal comprised of a coupling of said first control inputs of said first and said second switching means; and
a current steering output for coupling to said input terminal of one of said charge storage means.

9. A semiconductor oscillator circuit comprising:
a current generating circuit configured to provide a current that is inversely proportional to an operating temperature;
a first and a second capacitor configured to be alternately charged by said current generating circuit, said charge alternation producing a frequency of said semiconductor oscillator circuit, said frequency being inversely proportional to said operating temperature;
a first and a second switching circuit each having a first terminal coupled to said current generating circuit, a second terminal coupled to a ground terminal, a third terminal coupled to one of said capacitors, and a control terminal configured to receive a signal that dictates whether the capacitor is to be coupled to said current generating means or said ground;
a first and a second voltage detection circuit coupled to each of said first and said second capacitors, said voltage detection circuit configured to issue an activation signal at an output terminal when a potential at an input terminal of said first or said second capacitors reaches a predetermined magnitude of voltage; and
a complimentary switching circuit having a first and a second input terminal coupled to said output terminals of said first and said second voltage detection circuit and a first and a second output terminal each being coupled to one of said control terminals of said first and said second switching circuit, said first and said second output terminals configured to communicate complementary signals that are reversed every time an activation signal is received at one of said input terminals of said complimentary switching circuit.

10. The semiconductor oscillator circuit of claim 9, wherein said inverse proportionality of frequency producing a programming voltage of a magnitude for maintaining a longevity of a programmed memory cell.

11. The semiconductor oscillator circuit of claim 9, wherein a frequency of said semiconductor oscillator circuit is independent of a variation of plus 10 percent to minus 15 percent of a power supply voltage.

12. The semiconductor oscillator circuit of claim 9, wherein said complimentary switch circuit is an SR latch.

13. The semiconductor oscillator circuit of claim 9, wherein each of said first and said second voltage detection circuits is an op amp, each of said op amps having a negative terminal coupled to said input terminal of either one of said first or said second capacitors and a positive terminal coupled to a voltage reference.

14. The semiconductor oscillator circuit of claim 9, wherein each of said first and said second voltage detection circuits is an inverter, each of said inverters having an input terminal coupled to said input terminal of either one of said first or said second capacitors.

15. The semiconductor oscillator circuit of claim 9, wherein said current generating circuit further comprises a first NMOS transistor having a gate that is coupled to a power supply, a drain that is coupled to a source of a second NMOS transistor and a gate of a third NMOS transistor, a source that is coupled to a ground, said second NMOS transistor having a drain that is coupled to a drain of a first PMOS transistor and a gate that is coupled to a drain of said third NMOS transistor, said third NMOS transistor having a source that is coupled to a ground and a drain that is coupled to a drain of a second PMOS transistor, said first PMOS transistor having a source coupled to a power supply and a gate coupled to a drain of said first PMOS transistor, a gate of a third PMOS transistor, and a gate of a fourth PMOS transistor, said second PMOS transistor having a source that is coupled to a power supply and a gate that is coupled to a ground, said third PMOS transistor having a source that is coupled to a power supply and a drain coupled to said first switching circuit, said fourth PMOS transistor having a source that is coupled to said power supply and a drain that is coupled to said second switching circuit.

16. The semiconductor oscillator circuit of claim 9, wherein said switching circuit comprises a PMOS transistor and an NMOS transistor coupled at their respective drains to form a common node, each common node is further coupled to one of said first and said second capacitors, a source of said PMOS transistor being coupled to said current generating circuit, a source of said NMOS transistor being coupled to ground, and the gates of said PMOS transistor and said NMOS transistor being coupled together to form said control terminal of one of said switching circuits.

* * * * *